United States Patent
Schmidberger

(10) Patent No.: US 8,261,013 B2
(45) Date of Patent: Sep. 4, 2012

(54) METHOD FOR EVEN UTILIZATION OF A PLURALITY OF FLASH MEMORY CHIPS

(75) Inventor: Franz Schmidberger, Constance (DE)

(73) Assignee: Hyperstone GmbH, Constance (DE)

( * ) Notice: Subject to any disclaimer, the term of this patent is extended or adjusted under 35 U.S.C. 154(b) by 142 days.

(21) Appl. No.: 12/744,778

(22) PCT Filed: Nov. 26, 2007

(86) PCT No.: PCT/EP2007/062785
§ 371 (c)(1),
(2), (4) Date: May 26, 2010

(87) PCT Pub. No.: WO2009/068074
PCT Pub. Date: Jun. 4, 2009

(65) Prior Publication Data
US 2010/0306456 A1    Dec. 2, 2010

(51) Int. Cl.
*G11C 11/34* (2006.01)
*G06F 12/00* (2006.01)
(52) U.S. Cl. ........... 711/103; 365/185.33; 711/E12.001; 711/E12.008
(58) Field of Classification Search .................. 711/103, 711/E12.001, E12.008; 365/185.33
See application file for complete search history.

(56) References Cited

U.S. PATENT DOCUMENTS

| 5,406,529 A | 4/1995 | Asano |
| 5,822,251 A * | 10/1998 | Bruce et al. ............ 365/185.33 |
| 5,956,743 A * | 9/1999 | Bruce et al. .................. 711/103 |
| 6,081,447 A * | 6/2000 | Lofgren et al. .......... 365/185.02 |
| 2004/0156251 A1* | 8/2004 | Shiota et al. .................. 365/200 |
| 2006/0206770 A1* | 9/2006 | Chen et al. .................... 714/718 |
| 2007/0186033 A1* | 8/2007 | Shinagawa et al. ........... 711/103 |

FOREIGN PATENT DOCUMENTS
EP       0589597 A2    3/1994

* cited by examiner

*Primary Examiner* — Kevin Ellis
*Assistant Examiner* — Mehdi Namazi
(74) *Attorney, Agent, or Firm* — Laurence A. Greenberg; Werner H. Stemer; Ralph E. Locher

(57) ABSTRACT

A method for addressing a memory having a plurality of flash memory chips organized in erasable blocks, which in turn contain writable sectors, and where an erase counter is associated with each memory block. The overwriting of the sectors occurs by way of alternative memory blocks searched in the same chip for low erase counter values, as long as a threshold value of the erase counter is not exceeded. The copying operations are conducted efficiently using a copy command internal to the memory chip. As soon as the threshold value is exceeded, alternative memory blocks are searched in other memory chips as well.

7 Claims, 2 Drawing Sheets

METHOD FOR EVEN UTILIZATION OF A PLURALITY OF FLASH MEMORY CHIPS

BACKGROUND OF THE INVENTION

Field of the Invention

The invention relates to a method for addressing a memory having a plurality of flash memory chips organized in erasable blocks, which in turn comprise writable sectors, wherein a sector can only be written in an erased block and, each time a sector write command is to be executed, concerning a sector that has already been written, it is written to an alternative memory block address of a memory block, the corresponding sector of which is empty or erased, by means of a changed address conversion; and if however this alternatively addressed sector has already been written, the address conversion table provides another memory block address, in a memory block which is to be erased, as a new alternative memory block address, the corresponding sector of which is written, and the contents of the corresponding sectors of the newly associated memory block are written to the sectors that are still free in the memory block that was alternatively addressed before, and an erase counter is associated with each memory block.

Flash memory cells are gradually worn out by erase and rewrite operations. In SLC flash memories (single level cells) 100,000 write/erase operations per cell and in MLC flash memories (multi level cells) approximately 10,000 write/erase operations per cell can be executed before errors occur. An area of the flash memory can only be written to if it has previously been erased. Thus copy operations are necessary very frequently. The flash memory chips are divided into relatively large memory blocks, which are only erasable as a whole. A block usually has a size of 128 Kbytes. It is further divided into sectors of 512 bytes (or pages of for example 2 Kbytes) which can be written respectively. To "overwrite" data, an erased alternative memory block on the flash memory chip is used as a buffer block. Now, if for example data, which so far only have been written to the buffer block, are to be overwritten again, the buffer block has to be dissolved and therefore all unchanged sectors of the original user block have to be copied.

In order to maximize the life span of a flash card, all flash memory cells must be utilized, that is erased and rewritten, as evenly as possible, independent of the address areas currently used by the respective application. For example, frequent overwriting of the same file must not result in utilizing the same flash memory blocks again and again.

The blocks of a flash memory are addressed via logical block addresses, which then are associated with real memory block addresses by means of an address conversion table. If changes are made in the table, different real memory block addresses can be assigned to a logical block address and thus accumulation of erase operations on one real memory block is avoided.

A method is known from the patent U.S. Pat. No. 6,145,051, in which for each logical block address a first physical real memory address of a memory block is held in address conversion tables, and then if a sector of the first memory block, which had already been written, is to be written with new information another real memory block address is set. Because of this, the new information is written to the alternate block with the other memory block address, since immediate erasing would be relatively time-consuming and would cause avoidable wear to the memory block. In addition, status information about occupied/free sectors and sectors with outdated content, which are to be erased, is contained in the address conversion table. Such a table takes up a lot of space and, because of frequent and rapid access and because of continuous entry of the alternate block addresses and necessary restructuring of the address allocation when blocks are copied or erased, must be held in the auxiliary memory of the control processor, the content of which must be saved to the non-volatile memory in case of a power failure or shutdown.

The patent DE 102 27 256 C1 describes a method in which each block that is to be written is associated with an alternative block into which sectors which are to be overwritten are written and, if a sector is to be overwritten once more, another alternative block is associated and all unchanged sectors are copied from the original block to the first alternative memory block. These copy operations are implemented via a buffer memory in a volatile storage area. A counter is associated with each memory block, indicating how often the memory block has been written to.

Due to the frequently necessary copy operations, in many newer flash memory chips sectors or pages can be copied within the flash memory chip from one block to another previously erased block. The command used for this operation is called CopyBack and is executed rapidly. It makes use of a page buffer, which is located directly on the respective flash memory chip. So the CopyBack command can only be used for copy operations within one flash memory chip. The disadvantage of using this command is that on the different flash memory chips of a memory system significantly different wear levels result for single blocks. This way all blocks on one of the flash memory chips will have reached the maximum of erase cycles much earlier than those on the other chips. These blocks cannot any longer be written to correctly and have to be replaced by spare blocks. However, only a relatively small number of blocks are designated as spare blocks, usually 2% of all blocks. After all local spare blocks have been used, permanent errors would occur during write and erase operations and the card could not be written to any longer.

BRIEF SUMMARY OF THE INVENTION

It is the object of the invention to reveal a method which, makes use of the advantages of rapid copying by copy commands internal to the memory chip, but in addition realizes even wear of all memory blocks of a flash memory with several memory chips.

This object is achieved by the features of claim 1. Favourable embodiments of the method are indicated in the subclaims.

The CopyBack command is an internal copy command, which can be used as long as sectors can be copied locally from one memory block to another memory block on the same chip. Copying with this command is very rapid and thus effective. But if the erase counter reaches a defined threshold value for the number of erase operations within a block, all flash memory chips are searched for alternative memory blocks. If these blocks are located on another memory chip, the sectors copied to an additional volatile memory via another buffer memory.

In order to hold the efficiency of the memory operations on an high level for as long as possible, the defined threshold value, which sets off the search for alternative blocks on all flash memory chips, is favourably set to a very high value. A threshold value of approximately 90% of the maximum approved erase frequency is a good value to ensure a prolonged high efficiency of the memory system.

Real memory block addresses are associated with logical addresses via an allocation table. Favourably, the erase counters are also held in this table. Evaluation of the erase counter is simplified by splitting up the erase counter into a high-order portion and a low-order portion and checking only the high-order portion when searching for the memory blocks. This shortens the search procedure. Alternative memory blocks are also searched for on other flash memory chips if the address conversion for all logical blocks can no longer be realized on the same memory chip, that is, there are no longer a sufficient number of erased blocks available. This can be caused by defective blocks, if their number exceeds the number of spare blocks on one chip.

BRIEF DESCRIPTION OF THE SEVERAL VIEWS OF THE DRAWING

An embodiment of the method is described in the figures.

DESCRIPTION OF THE INVENTION

Figure 1:
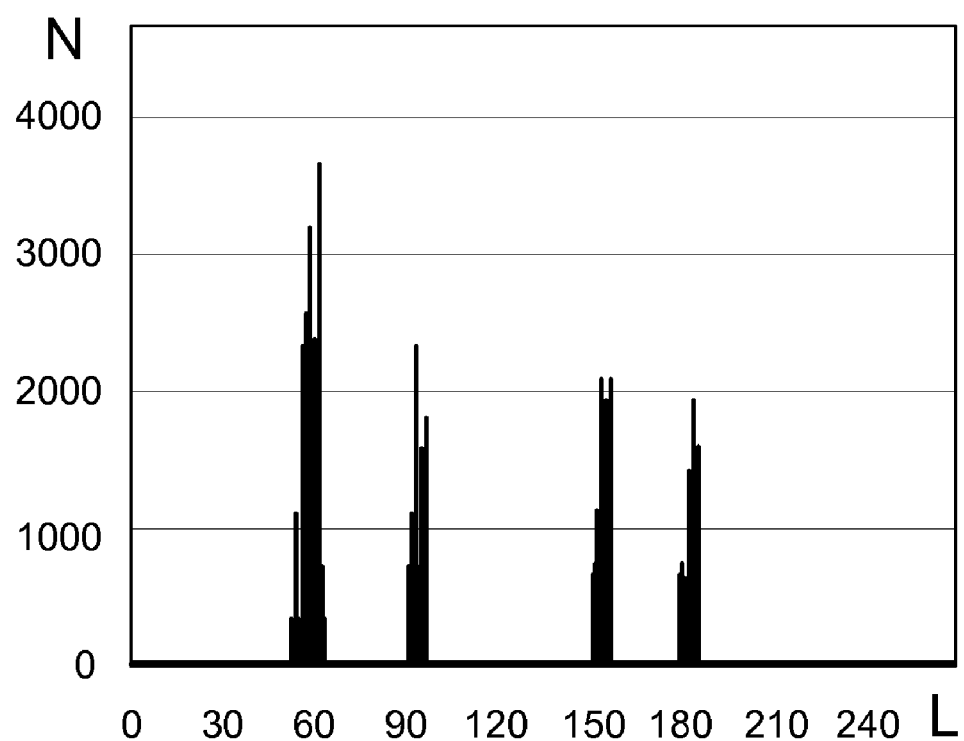
FIG. 1 shows an exemplary distribution of erase frequencies in a memory card with a plurality of flash memory, without implementation of the method.

FIG. 1 shows the distribution of the high-order portion of the count L of an erase counter in a memory chip, which can take on values between 0 and 255. The number of blocks N is indicated by an erase count L. The figure depicts the situation after intense utilization of the memory. If alternative memory blocks are searched for only locally on the memory chip, clusters of frequently erased memory blocks are formed. These clusters are dissolved, or rather converge to a single cluster, if the search is performed on all memory chips.

Figure 2:
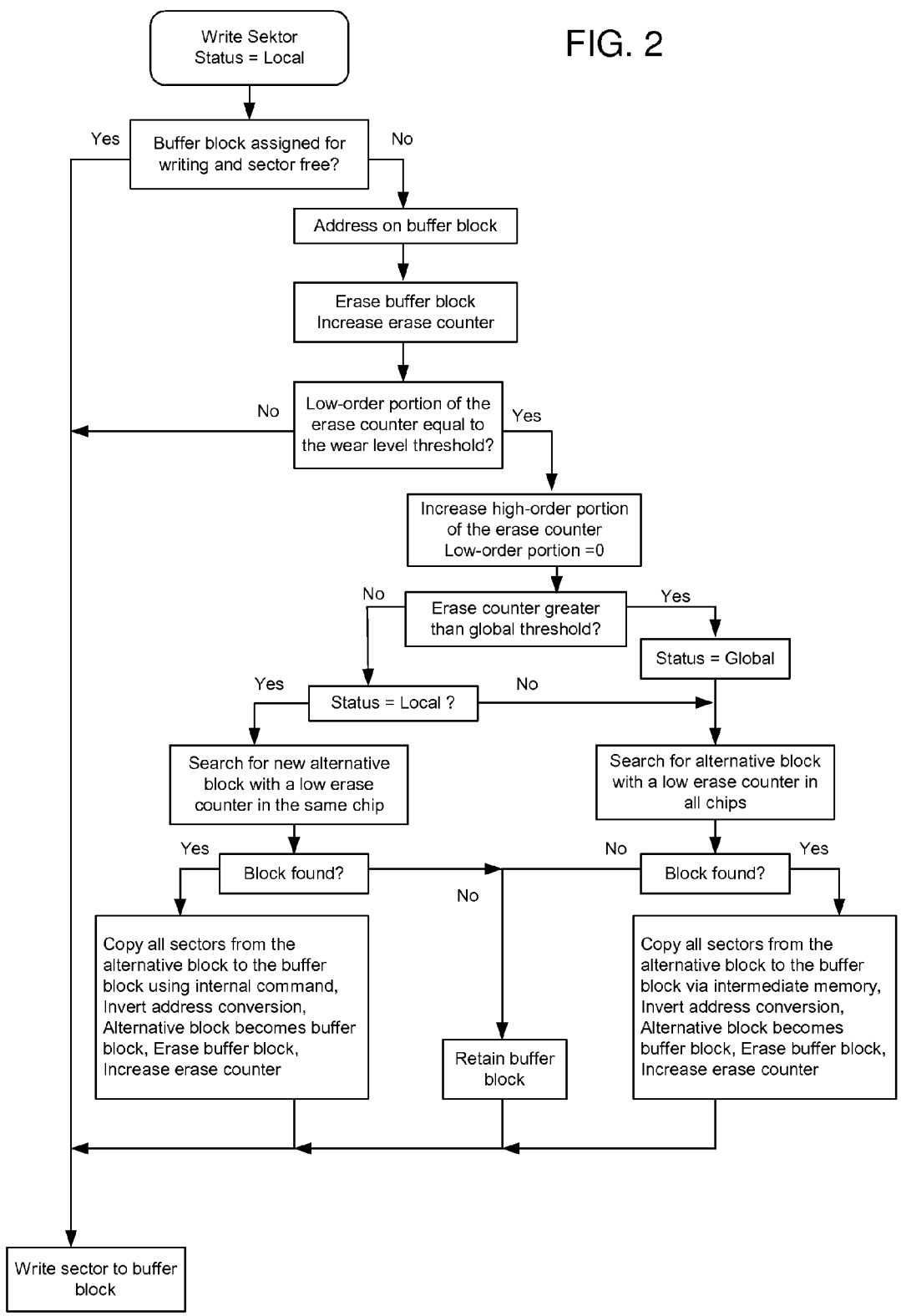
FIG. 2 shows a flowchart for the method.

FIG. 2 is a flowchart for an implementation of the method. There is a write command for a sector in a memory block. At first it is assumed that the status of wear levelling is such that a local search for free buffer blocks can be performed. In case a buffer block is associated for writing and the sector to be written is empty (possesses the content after erasing), the sector is written.

In case the sector is not free, a new buffer block is addressed. If necessary, this block is erased and the erase count is incremented. Now it is checked, whether the low-order portion of the erase counter corresponds to a wear level threshold, indicating the erase frequency of a memory block starting from which another memory block is to be used. In case this threshold is not reached, the sector is written. In case the wear level threshold is reached, the high-order portion of the erase counter is incremented and the low-order portion is reset.

Now it is checked whether the erase counter has reached a threshold value, starting from which all memory chips are searched for blocks with a low erase counter. In case this threshold value has not yet been reached, an alternate block is searched for on the same chip. If it is found, all sectors are copied from the alternate block to the buffer block with the internal CopyBack command. The blocks are exchanged by address conversion, so that the alternate block becomes the new buffer block. The new buffer block is erased and the erase counter is incremented. The sector is written to this buffer block which is now free.

If by incrementing the high-order portion of the erase counter the threshold value for searching all memory chips has been exceeded, the wear levelling status is set to "global" and all memory chips are searched for an alternate block with a low erase count. If it is found, all sectors are copied from the alternate block to the buffer block via a buffer, for example a RAM-area of a memory controller. The blocks are exchanged by address conversion, so that the alternate block becomes the new buffer block. The new buffer block is erased and the erase counter is incremented. The sector is written to this buffer block which is now free.

In case the search for an alternate block is not successful, the sector is written to the existing current buffer block. This is only the case if the high-order portions of the erase counters in the memory blocks on all memory chips have already reached the respective high value.

This method ensures that the overall wear of a flash memory consisting of a plurality of chips is even, and that, however, rapid copy operations within one chip are used until a high threshold value is reached.

The invention claimed is:

1. A method of addressing a memory having a plurality of flash memory chips organized in erasable blocks, wherein the blocks contain writable sectors, and a sector can only be written if the block is an erased block, the method which comprises:

each time a sector write command is to be executed, concerning a sector that has already been written, providing a changed address conversion and writing to an alternative memory block address of a memory block having a sector that is empty or erased;

if the alternatively addressed sector has already been written, providing with the address conversion table another memory block address, in a memory block that is to be erased, as a new alternative memory block address, and writing to the corresponding sector, and writing the contents of the corresponding sectors of the newly associated memory block to the sectors that are still free in the memory block that was alternatively addressed before;

associating an erase counter with each memory block representing a count of its erase operations; and until a defined threshold value of an erase counter is reached, each time an alternative memory block is provided, searching for a memory block with a low erase counter value on the same flash memory chip; and when the defined threshold value is exceeded, searching all flash memory chips for a memory block with a low erase counter value and providing the memory block thus found as the alternative memory block.

2. The method according to claim 1, which comprises using an internal copying command for copying sectors to an alternatively addressed memory block within the same flash memory chip.

3. The method according to claim 1, which comprises using an additional buffer memory for copying sectors to an alternatively addressed memory block outside the same flash memory chip.

4. The method according to claim 1, wherein the defined threshold value is approximately 90% of a maximum permitted erase frequency.

5. The method according to claim 1, which comprises implementing the address conversion via an allocation table that associates logical memory block addresses to real memory block addresses, and which also holds the erase counters.

6. The method according to claim 1, wherein the erase counter of a memory block is divided into a low-order portion and a high-order portion, and the method comprises using only the high-order portion for searching for alternative memory blocks.

7. The method according to claim 1, which comprises also searching all flash memory chips for a memory block with a low erase counter value, if no other erased block is available any more as buffer block on the same flash memory chip.

* * * * *